United States Patent [19]

Huang et al.

[11] Patent Number: 5,374,586
[45] Date of Patent: Dec. 20, 1994

[54] MULTI-LOCOS (LOCAL OXIDATION OF SILICON) ISOLATION PROCESS

[75] Inventors: Cheng H. Huang, Hsin-chu; Water Lur, Taipei, both of Taiwan, Prov. of China

[73] Assignee: United Microelectronics Corporation, Hsinchu, Taiwan, Prov. of China

[21] Appl. No.: 127,053

[22] Filed: Sep. 27, 1993

[51] Int. Cl.⁵ .......................................... H01L 21/302
[52] U.S. Cl. ...................................................... 437/69
[58] Field of Search ................ 437/69, 61, 62, 979; 148/DIG. 85, DIG. 86, DIG. 117

[56] References Cited

U.S. PATENT DOCUMENTS

| | | | |
|---|---|---|---|
| 5,061,654 | 10/1991 | Shimizu et al. | 437/70 |
| 5,128,274 | 7/1992 | Yabu et al. | 437/70 |
| 5,134,089 | 7/1992 | Barden et al. | 437/61 |
| 5,155,055 | 10/1992 | Gill et al. | 437/979 |
| 5,173,438 | 12/1992 | Sandhu | 437/63 |
| 5,234,859 | 8/1993 | Mametani et al. | 437/69 |

FOREIGN PATENT DOCUMENTS

| | | | |
|---|---|---|---|
| 63-12149 | 1/1988 | Japan | 437/69 |
| 63-244627 | 10/1988 | Japan | 437/69 |

OTHER PUBLICATIONS

VLSI Technology, International Edition, by S. M. Sze, McGraw-Hill Book Company, N.Y., N.Y. c, 1988 by McGraw Hill Book Co. pp. 473–474.

Primary Examiner—Olik Chaudhuri
Assistant Examiner—S. Mulpuri
Attorney, Agent, or Firm—George O. Saile

[57] ABSTRACT

A new method of local oxidation using a multiple process is described. A thin silicon oxide layer is formed over the surface of a silicon substrate. A layer of silicon nitride is deposited overlying the silicon oxide layer. The silicon oxide and silicon nitride layers are patterned to provide openings of the smallest size exposing portions of the silicon substrate to he oxidized and growing field oxide regions within these smallest size openings. The patterning and growing of field oxide regions is repeated for each larger size of opening required. The silicon nitride and silicon oxide layers are removed, thereby completing local oxidation of the integrated circuit.

8 Claims, 3 Drawing Sheets

MULTI-LOCOS (LOCAL OXIDATION OF SILICON) ISOLATION PROCESS

BACKGROUND OF THE INVENTION

1. Field of the Invention

This invention relates to the fabrication of integrated circuit devices and more particularly to a method of local oxidation using a multiple LOCOS process in the fabrication of integrated circuits.

2. Description of the Prior Art

Local oxidation of silicon (LOCOS) is the conventional lateral isolation scheme. The conventional local oxidation process is described in *VLSI Technology*, International Edition, by S. M. Sze, McGraw-Hill Book Company, NY, N.Y., c. 1988 by McGraw-Hill Book Co., pp. 473–474. Referring to FIG. 1, a layer of silicon nitride 14 is deposited over a pad oxide 12 overlying a silicon substrate 10. The pad oxide is a thin thermal oxide which allows better adhesion between the nitride and silicon and which acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

However, as the silicon nitride opening between active device regions is reduced to the submicrometer regime, a reduction in field oxide thickness within the opening has been observed. Referring to FIG. 2, field oxide regions 16, 18, and 20 are not of the same thickness. The thickness T of the field oxide regions is largest for the wider opening and smallest for the narrower opening. That is, $T_{16} < T_{18} < T_{20}$. This thinning of the field oxide region will lead to substantially reduced field threshold voltage and additional field edge leakage current. Thus, the field oxide thinning effect will be the barrier to scaling down isolation width in ultra large scale integrated circuits (ULSI).

U.S. Pat. Nos. 5,061,654 to Shimizu et al and 5,128,274 to Yabu et al describe methods for purposefully making field oxide regions to be of different thicknesses. U.S. Pat. No. 5,173,438 to Sandhu shows a method for adjusting ion implantation to achieve different field oxide thicknesses. The purpose of the present invention is to achieve the same field oxide thicknesses for different sized openings.

SUMMARY OF THE INVENTION

A principal object of the invention is to provide an effective and very manufacturable method to locally oxidize the silicon in an integrated circuit.

Another object of the present invention is to provide a method of local oxidation of silicon that will provide nearly the same field oxide thicknesses in the different sized nitride openings.

Yet another object is to provide a method of local oxidation which can be used in the fabrication of ULSI active isolation.

In accordance with the objects of this invention, a new method of local oxidation using a multiple process is achieved. A thin silicon oxide layer is formed over the surface of a silicon substrate. A layer of silicon nitride is deposited overlying the silicon oxide layer. The silicon oxide and silicon nitride layers are patterned to provide openings of the smallest size exposing portions of the silicon substrate to be oxidized and growing field oxide regions within these smallest size openings. The patterning and growing of field oxide regions is repeated for each larger size of opening required. The silicon nitride and silicon oxide layers are removed, thereby completing local oxidation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
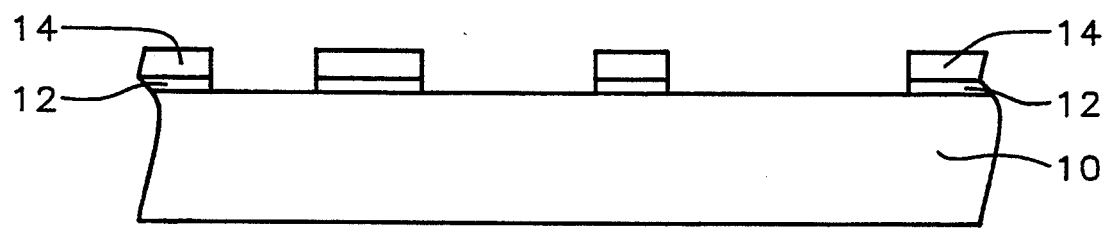
FIGS. 1 and 2 schematically illustrate in cross-sectional representation the conventional LOCOS process.
Figure 2:
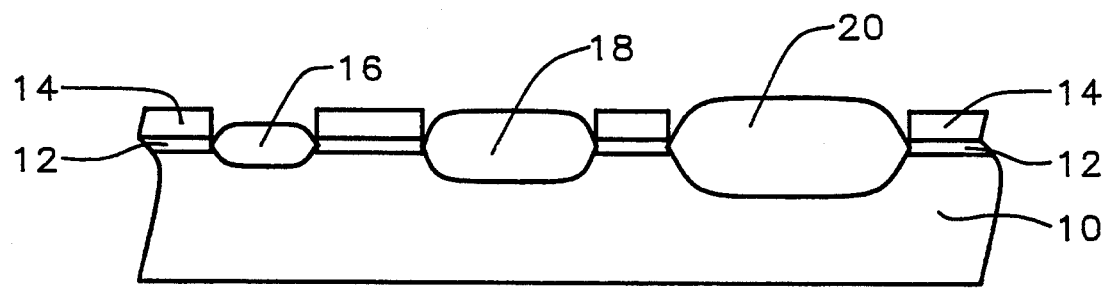
Figure 3:
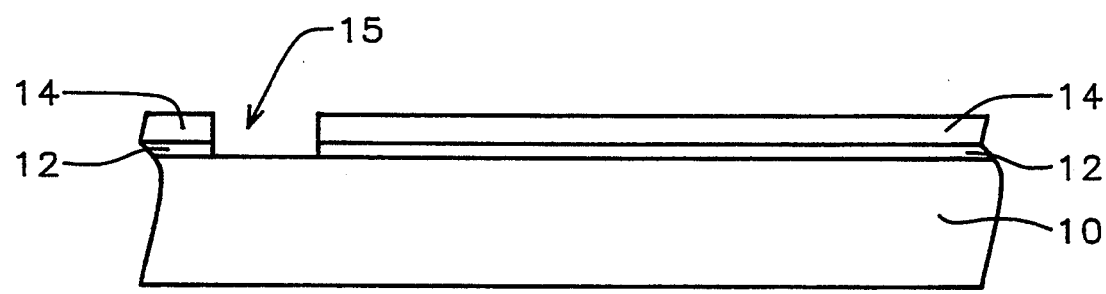
FIGS. 3 through 8 schematically illustrate in cross-sectional representation one preferred embodiment of the present invention.

Referring now more particularly to FIG. 3, there is shown a monocrystalline silicon substrate 10. A layer 12 of silicon dioxide is deposited over the substrate by thermal oxidation or chemical vapor deposition to a preferred thickness of between about 100 to 500 Angstroms. A layer of silicon nitride ($Si_3N_4$) 14 is deposited over the silicon oxide layer by chemical vapor deposition to a thickness of between about 500 to 3000 Angstroms.

The silicon nitride and silicon oxide layers are patterned using conventional lithography and etching techniques, such as plasma dry etching, to provide openings 15 of the same size to the silicon substrate 10 in the places where the isolation regions are to be formed. These openings first defined must be the smallest openings required. Some of the silicon substrate may be etched away so that a recessed field oxide will be formed.

Figure 4:
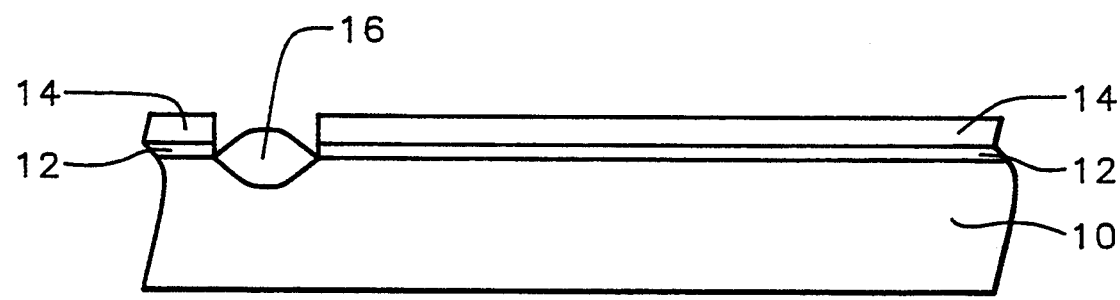

Referring now to FIG. 4, the field oxide region 16 is grown within the openings of the smallest size. The field oxide is grown in a conventional furnace with an oxygenic ambient, such as $O_2$ or $H_2O$, or the like, at a temperature of between about 800° to 1100° C. for from 30 minutes to several hours.

Figure 5:
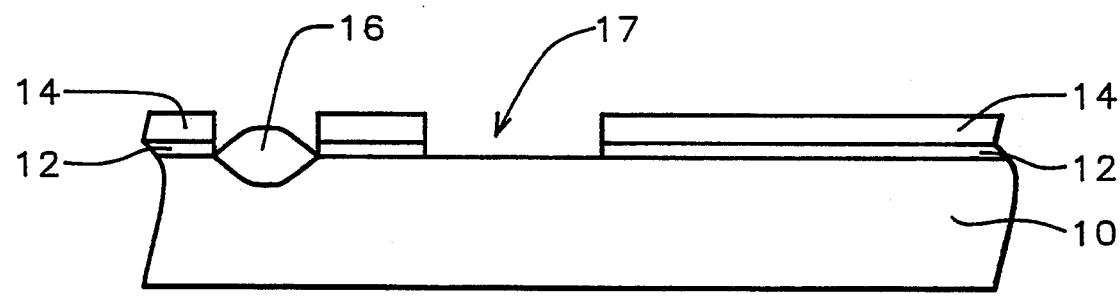
Figure 6:
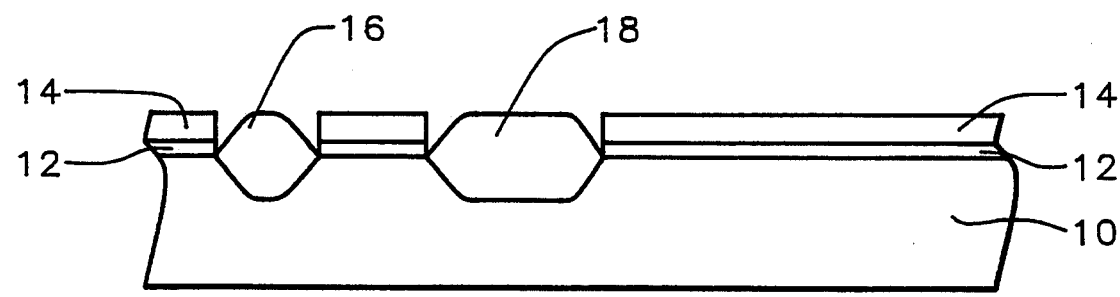

Next, the silicon nitride and silicon oxide layers are patterned to provide openings 17 of the next larger size to the silicon substrate, shown in FIG. 5. A second field oxidation is performed to provide field oxidation (FOX) region 18 shown in FIG. 6. FOX region 16 also increases in thickness during this field oxidation.

Figure 7:
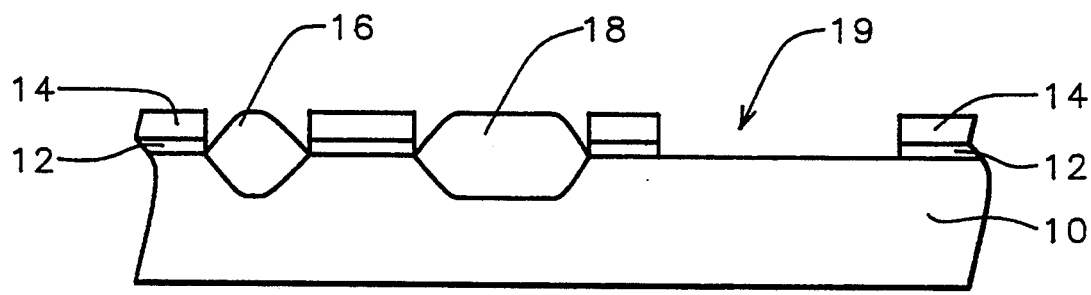
Figure 8:
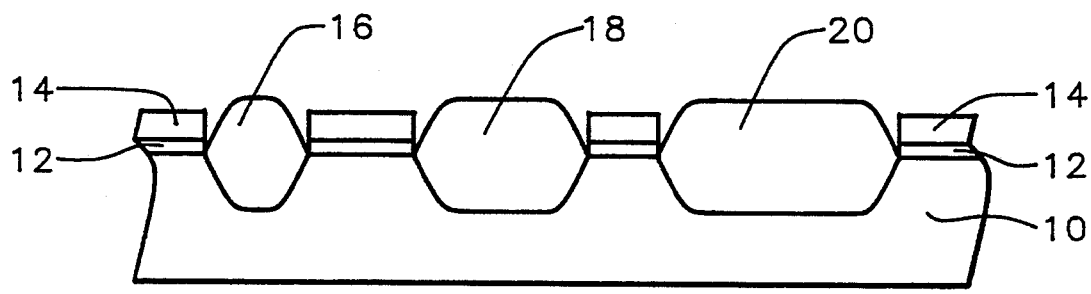

The patterning of layers 12 and 14 to provide openings of increasing sizes, one size at a time, and field oxidation within those openings is repeated as required until all local oxidation is completed. FIGS. 7 and 8 show the opening 19 and field oxidation region 20. The field oxide thickness are within the preferred range of between about 3000 to 10,000 Angstroms. Thinner field oxide regions are required for submicron devices, especially for lower power supply devices.

All openings desired can be divided into three or more groups. For instance, the smallest group (S) ranges in size from 0.3 to 0.5 microns, the middle group (M) ranges from 0.5 to 0.8 microns, and the largest group (L) has openings larger than 0.8 microns.

The growth rate of field oxide is closely related to the opening size and the existing oxide thickness. For example, in order to grow a field oxide with thickness of about 5000 Angstroms, +/− 300 Angstroms, in openings larger than 0.8 microns, the oxidation time is about 400 minutes at 900° C. in oxygenic ambient. For openings with sizes of 0.6 and 0.4 microns, the oxidation durations are about 500 and 700 minutes, respectively, under the same conditions. Therefore, in this invention, the first oxidation time for the smallest openings, e.g. about 0.4 microns, is 200 minutes. The second oxidation after the middle-sized openings have been patterned, e.g. about 0.6 microns, is about 100 minutes. The third oxidation time after the largest openings have been patterned is about 400 minutes.

In summary, for openings S, the total oxidation time is 200+100+400=700 minutes, for openings M, the total oxidation time is 100+400=500 minutes, and for openings L, the total oxidation time is only 400 minutes. Therefore, we can perform oxidation with different time durations for different opening sizes to obtain nearly the same thickness of field oxide within all openings.

Layers 14 and 12 are removed by dipping the wafer in phosphoric acid and hydrofluoric acid solutions, completing the local oxidation as shown in FIG. 8.

The process of the present invention results in field oxide thicknesses that are nearly equal for all sizes of openings, including the submicrometer openings required for ULSI manufacture.

Figure 9:
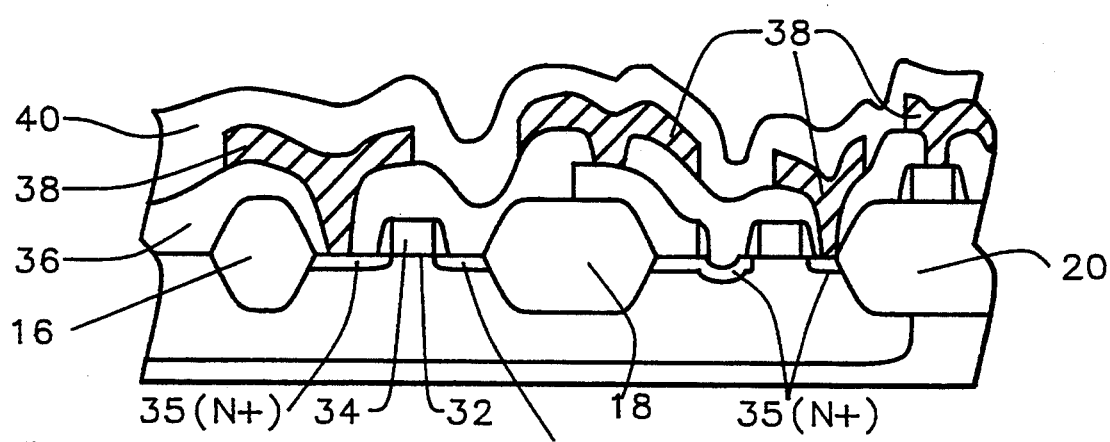
FIG. 9 schematically illustrates in cross-sectional representation a completed integrated circuit of the present invention.

The integrated circuit may be completed as is conventional in the art. For example, referring to FIG. 9, gate oxide layer 32 may be deposited followed by patterning to provide openings for buried contact regions. A threshold-adjust ion implant may be required at this point. Next, gate electrode 34 and source/drain regions 35 are fabricated. Dielectric layer 36, which may be a phosphorus-doped chemical vapor deposited oxide or borophosphosilicate glass (BPSG) is deposited. Contact openings are etched through the dielectric layer to expose the source/drain regions where contacts are desired. Metal layer 38, typically aluminum, is deposited and patterned to complete contacts to the source/drain regions followed by the deposition of a top capping layer 40 of silicon nitride and/or an oxide to complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of local oxidation of an integrated circuit wherein all field oxide regions are of substantially the same thickness comprising:

forming a silicon oxide layer over the surface of a silicon substrate;

depositing a layer of silicon nitride overlying said silicon oxide layer;

patterning said silicon oxide and silicon nitride layers to provide openings of a first size exposing portions of said silicon substrate to be oxidized;

growing said field oxide regions within said openings of said first size;

patterning said silicon nitride layer to provide openings of a second size exposing portions of said silicon substrate to be oxidized wherein said second size is larger than said first size;

growing said field oxide regions within said openings of said second size wherein said field oxide regions within said openings of said first size increase in thickness;

removing said silicon nitride and said silicon oxide layers thereby completing local oxidation of said integrated circuit.

2. The method of claim 1 wherein said silicon oxide layer has a thickness of between about 100 to 500 Angstroms.

3. The method of claim 1 wherein said silicon nitride layer has a thickness of between about 500 to 3000 Angstroms.

4. The method of claim 1 wherein said field oxide regions are grown to a thickness of between about 3000 to 10,000 Angstroms.

5. The method of local oxidation of an integrated circuit wherein all field oxide regions are of substantially the same thickness comprising:

forming a silicon oxide layer over the surface of a silicon substrate;

depositing a layer of silicon nitride overlying said silicon oxide layer;

patterning said silicon oxide and silicon nitride layers to provide openings of the same size exposing portions of said silicon substrate to be oxidized and growing said field oxide regions within said same size openings;

repeating said patterning and growing of said field oxide regions for each size of openings required wherein said patterning and growing of said field oxide regions is done in increasing size order of openings and removing said silicon nitride and said silicon oxide layers thereby completing local oxidation of said integrated circuit.

6. The method of claim 5 wherein said silicon oxide layer has a thickness of between about 100 to 500 Angstroms.

7. The method of claim 5 wherein said silicon nitride layer has a thickness of between about 500 to 3000 Angstroms.

8. The method of claim 7 wherein said field oxide regions are grown to a thickness of between about 3000 to 10,000 Angstroms.

* * * * *